US010198997B2

(12) United States Patent
Jeong et al.

(10) Patent No.: US 10,198,997 B2
(45) Date of Patent: Feb. 5, 2019

(54) SCAN DRIVER CIRCUIT AND DRIVING METHOD FOR THE SCAN DRIVER CIRCUIT

(71) Applicant: SAMSUNG DISPLAY CO., LTD., Yongin-si, Gyeonggi-do (KR)

(72) Inventors: Jin Tae Jeong, Suwon-si (KR); Ji Su Na, Yongin (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 478 days.

(21) Appl. No.: 14/855,692

(22) Filed: Sep. 16, 2015

(65) Prior Publication Data

US 2016/0240145 A1    Aug. 18, 2016

(30) Foreign Application Priority Data

Feb. 17, 2015    (KR) .................. 10-2015-0024472

(51) Int. Cl.
*G09G 3/3266* (2016.01)
*G06F 1/04* (2006.01)
(Continued)

(52) U.S. Cl.
CPC ............ *G09G 3/3266* (2013.01); *G06F 1/04* (2013.01); *G09G 3/3233* (2013.01); *G11C 19/188* (2013.01); *G09G 2300/0819* (2013.01); *G09G 2300/0852* (2013.01); *G09G 2300/0861* (2013.01); *G09G 2310/0205* (2013.01); *G09G 2310/0251* (2013.01); *G09G 2310/0262* (2013.01); *G09G 2310/0286* (2013.01);
(Continued)

(58) Field of Classification Search
CPC .................. G11C 27/04; C11C 19/285; G09G 2310/0286; G09G 3/3266; G09G 3/3674
See application file for complete search history.

(56) References Cited

U.S. PATENT DOCUMENTS

2010/0110047 A1*  5/2010  Yoon ..................... G09G 3/3677
                                                                345/204
2013/0038587 A1*  2/2013  Song ........................ G09G 5/18
                                                                345/211

(Continued)

FOREIGN PATENT DOCUMENTS

KR        10-0661468 B1    12/2006
KR    10-2012-0078557 A     7/2012
(Continued)

*Primary Examiner* — Kent W Chang
*Assistant Examiner* — Nathaniel P Brittingham
(74) *Attorney, Agent, or Firm* — Lee & Morse, P.C.

(57) ABSTRACT

A scan driving circuit includes a plurality of stages, each having a shift register and a scan signal output unit. The shift register has a first node to receive a first driving voltage according to a control signal and a second node to receive the first driving voltage according to a reset signal. The scan signal output unit outputs scan signals to respective scan lines. The scan signal output unit has a plurality of clock switches controlled according to a voltage of the first node and a plurality of switches controlled according to a voltage of the second node. The clock switches sequentially output clock signals to respective third nodes, which are connected to respective scan lines. The switches output a second driving voltage to the third nodes.

6 Claims, 9 Drawing Sheets

(51) Int. Cl.
*G09G 3/3233* (2016.01)
*G11C 19/18* (2006.01)

(52) U.S. Cl.
CPC ............... *G09G 2320/0209* (2013.01); *G09G 2320/0233* (2013.01); *G09G 2320/043* (2013.01)

(56) References Cited

U.S. PATENT DOCUMENTS

| | | | | |
|---|---|---|---|---|
| 2014/0049712 A1* | 2/2014 | Yu | ........................ | G02F 1/13306 349/34 |
| 2014/0071035 A1* | 3/2014 | Yu | ........................ | G09G 3/3677 345/100 |
| 2014/0241487 A1* | 8/2014 | Yamazaki | ............... | G11C 19/28 377/54 |
| 2014/0300399 A1* | 10/2014 | Miyake | ................. | G09G 3/3677 327/296 |
| 2015/0015474 A1* | 1/2015 | Miyake | ................. | G09G 3/3677 345/100 |
| 2016/0240145 A1* | 8/2016 | Jeong | .................... | G09G 3/3233 |
| 2017/0076684 A1* | 3/2017 | Kim | ..................... | G09G 3/3677 |
| 2017/0186378 A1* | 6/2017 | Na | ........................ | G09G 3/3266 |

FOREIGN PATENT DOCUMENTS

| | | |
|---|---|---|
| KR | 10-2013-0051750 A | 5/2013 |
| KR | 10-2014-0020484 A | 2/2014 |
| KR | 10-2014-0137504 A | 12/2014 |

\* cited by examiner

US 10,198,997 B2

SCAN DRIVER CIRCUIT AND DRIVING METHOD FOR THE SCAN DRIVER CIRCUIT

CROSS-REFERENCE TO RELATED APPLICATION

Korean Patent Application No. 10-2015-0024472, filed on Feb. 17, 2015, and entitled, "Scan Driver Circuit and Driving Method for the Scan Driver Circuit," is incorporated by reference herein in its entirety.

BACKGROUND

1. Field

One or more embodiments disclosed herein relate to a scan driving circuit and a driving method for the scan driving circuit.

2. Description of the Related Art

Personal computers, portable phones, portable information terminals, and monitors of various information devices are all equipped with displays. The display may be, for example, a liquid crystal display, an organic light emitting diode display, or a plasma display panel. An organic light emitting diode display in particular has excellent emission efficiency, luminance, viewing angle, and response time.

An organic light emitting diode display generates images using pixels that include organic light emitting diodes. The pixels are arranged in a matrix at cross points of data lines, scan lines, and power supply lines. In addition to an organic light emitting diode, each pixel includes a driving transistor and one or more capacitors. Light is emitted from the diode based on a recombination of electrons and holes in a light emitting active layer.

Over time, the amount of current flowing in the organic light emitting diode of each pixel may change based on a deviation in the threshold voltage of the driving transistor. As a result, non-uniformity may occur in the display. Additionally, the characteristics of the driving transistor may change based on manufacturing process parameters. Because it is difficult for the transistors in an organic light emitting diode display to have the same characteristics, the threshold voltage deviation of the driving transistors in the pixels may be different.

In attempt to overcome this deviation, a compensation circuit may be used in each pixel. The compensation circuit may charge a voltage corresponding to the threshold voltage of the driving transistor for 1 horizontal period. However, in some displays and especially in a high-resolution organic light emitting diode display, coupling may occur in a parasitic capacitor between lines and horizontal striped patterns. This may adversely affect display performance.

SUMMARY

In accordance with one or more embodiments, a scan driving circuit includes a plurality of stages, each of the stages including a shift register including a first node to receive a first driving voltage according to a control signal and a second node to receive the first driving voltage according to a reset signal; and a scan signal output unit to output a plurality of scan signals to a respective plurality of scan lines, the scan signal output unit including a plurality of clock switches controlled according to a voltage of the first node and a plurality of switches controlled according to a voltage of the second node, wherein: the clock switches are to sequentially output a plurality of clock signals to a respective plurality of third nodes, the third nodes connected to respective ones of the scan lines, and the switches are to output a second driving voltage to the third nodes connected to respective one of the scan lines.

The scan signal output unit may receive the clock signals in a predetermined unit group unit and to output the scan signals as unit group scan signals. The stages may include a current stage and a previous stage, and while the current stage outputs the clock signals to the third nodes corresponding to the scan signals, the previous stage may output the second driving voltage to the third nodes corresponding to the scan signals.

The control signal may carry signal of the previous stage, and the shift register may include a first transistor including a first electrode to receive the first driving voltage, a second electrode connected to the first node, and a control electrode to receive the carry signal of the previous stage; a second transistor including a first electrode to receive the second driving voltage, a second electrode connected to a carry signal line of the current stage, and a control electrode connected to the second node; a third transistor including a first electrode connected to the carry signal line of the current stage, a second electrode connected to a COM clock signal line, and a control electrode connected to the first node; and a fourth transistor including a first electrode to receive the second driving voltage, a second electrode connected to the second node, and a control electrode connected to the second electrode of the first transistor, and the control signal is a carry signal of the previous stage.

The shift register may include a fifth transistor including a first electrode to receive the second driving voltage, a second electrode connected to the first node, and a control electrode connected to the second node; a sixth transistor including a first electrode to receive the first driving voltage, a second electrode connected to the second node, and a control electrode connected to a reset signal line; and a seventh transistor including a first electrode connected to the second electrode of the first transistor, a second electrode connected to the first node, and a control electrode to which the second driving voltage is applied.

The clock switches may include first electrodes to receive respective ones of the clock signals, second electrodes connected to the third nodes which are connected to corresponding ones of the scan lines, and control electrodes connected to the first node, the scan driving circuit may include a plurality of on switches, each of the on switches including a first electrode connected to the first node, a second electrode connected to the control electrode of a corresponding one of the clock switches, and a control electrode to receive the first driving voltage; and a plurality of capacitors, each of the capacitors connected between the second electrode and the control electrode of a corresponding one of the clock switches, the on switches to be continuously turned on.

The shift register may include an eighth transistor including a first electrode to receive the carry signal of the current stage, a second electrode connected to the first node, and a control electrode connected to a COM clock signal line; a ninth transistor including a first electrode to receive the second driving voltage, a second electrode connected to the carry signal line of the current stage, and a control electrode connected to the second node; and a tenth transistor including a first electrode connected to the carry signal line of the current stage, a second electrode connected to a coupling signal line, and a control electrode connected to the first node, and the control signal is the COM clock signal.

The scan driving circuit may include a capacitor between the second electrode and the control electrode of the tenth transistor, wherein the first node is to receive the first driving voltage at a first level and is to receive a voltage at a third level when a coupling voltage with a second level is applied to the coupling signal line.

The shift register may include an eleventh transistor including a first electrode to receive the second driving voltage, a second electrode connected to the first node, and a control electrode connected to the first node; a twelfth transistor including a first electrode to receive the second driving voltage, a second electrode connected to the second node, and a control electrode connected to the second node; and a thirteenth transistor including a first electrode to receive the first driving voltage, a second electrode connected to the second node, and a control electrode connected to the reset signal line.

In accordance with one or more other embodiments, a method drives a scan driving circuit having a plurality of stages, each of the stages including a shift register and a scan signal output unit, the shift register including a first node and a second node, the scan signal output unit including a plurality of clock switches controlled according to a voltage of the first node and a plurality of switches controlled according to a voltage of the second node, the method comprising: applying a first driving voltage to the first node according to a control signal; inputting a plurality of clock signals to each of the plurality of stages; sequentially outputting the clock signals to nodes connected to a respective plurality of scan lines; outputting a carry signal according to a COM clock signal; applying the first driving voltage to the second node according to a reset signal; and outputting a second driving voltage to the nodes connected to the scan lines.

Inputting the clock signals to each of the stages may include inputting the clock signals in a predetermined unit group unit, the nodes may output scan signals to respective ones of the scan lines as unit group scan signals. Each stage may include a current stage and a previous stage, and the method may include outputting the second driving voltage to the nodes connected to the scan lines in a previous stage while the clock signal are output to the nodes connected to the scan lines in the current stage.

The shift register may include a first transistor including a first electrode to receive the first driving voltage, a second electrode connected to the first node, and a control electrode to receive a carry signal of the previous stage; a second transistor including a first electrode to receive the second driving voltage, a second electrode connected to a carry signal line of the current stage, and a control electrode connected to the second node; a third transistor including a first electrode connected to the carry signal line of the current stage, a second electrode connected to a COM clock signal line, and a control electrode connected to the first node; and a fourth transistor including a first electrode to receive the second driving voltage is applied, a second electrode connected to the second node, and a control electrode connected to the second electrode of the first transistor, and the control signal is a carry signal of the previous stage.

The shift register may include a fifth transistor including a first electrode to receive the second driving voltage, a second electrode connected to the first node, and a control electrode connected to the second node; a sixth transistor including a first electrode to receive the first driving voltage, a second electrode connected to the second node, and a control electrode connected to a reset signal line; and a seventh transistor including a first electrode connected to the second electrode of the first transistor, a second electrode connected to the first node, and a control electrode to receive the second driving voltage.

The scan signal output unit may include a plurality of clock switches, each clock switch including a first electrode to receive a corresponding one of the clock signals, a second electrode connected to a corresponding one of the scan lines, and a control electrode connected to the first node; a plurality of on switches, each of the on switches including a first electrode connected to the first node, a second electrode connected to the control electrode of a corresponding one of the clock switches, and a control electrode to receive the first driving voltage; and a plurality of capacitors, each of the capacitors connected between the second electrode and the control electrode of a corresponding one of the clock switches, the on switches continuously turned on.

The shift register may include an eighth transistor including a first electrode to receive a carry signal of the current stage, a second electrode connected to the first node, and a control electrode connected to a COM clock signal line; a ninth transistor including a first electrode to receive the second driving voltage, a second electrode connected to a carry signal line of the current stage, and a control electrode connected to the second node; and a tenth transistor including a first electrode connected to the carry signal line of the current stage, a second electrode connected to a coupling signal line, and a control electrode connected to the first node, the control signal corresponding to the COM clock signal.

A capacitor may be between the second electrode and the control electrode of the tenth transistor, and wherein the method may further include applying the first driving voltage at a first level to the first node; applying a coupling voltage at a second level to the coupling signal line; and applying a voltage at a third level to the first node.

The shift register may include an eleventh transistor including a first electrode to receive the second driving voltage, a second electrode connected to the first node, and a control electrode connected to the first node; a twelfth transistor including a first electrode to receive the second driving voltage, a second electrode connected to the second node, and a control electrode connected to the second node; and a thirteenth transistor including a first electrode to receive the first driving voltage, a second electrode connected to the second node, and a control electrode connected to the reset signal line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
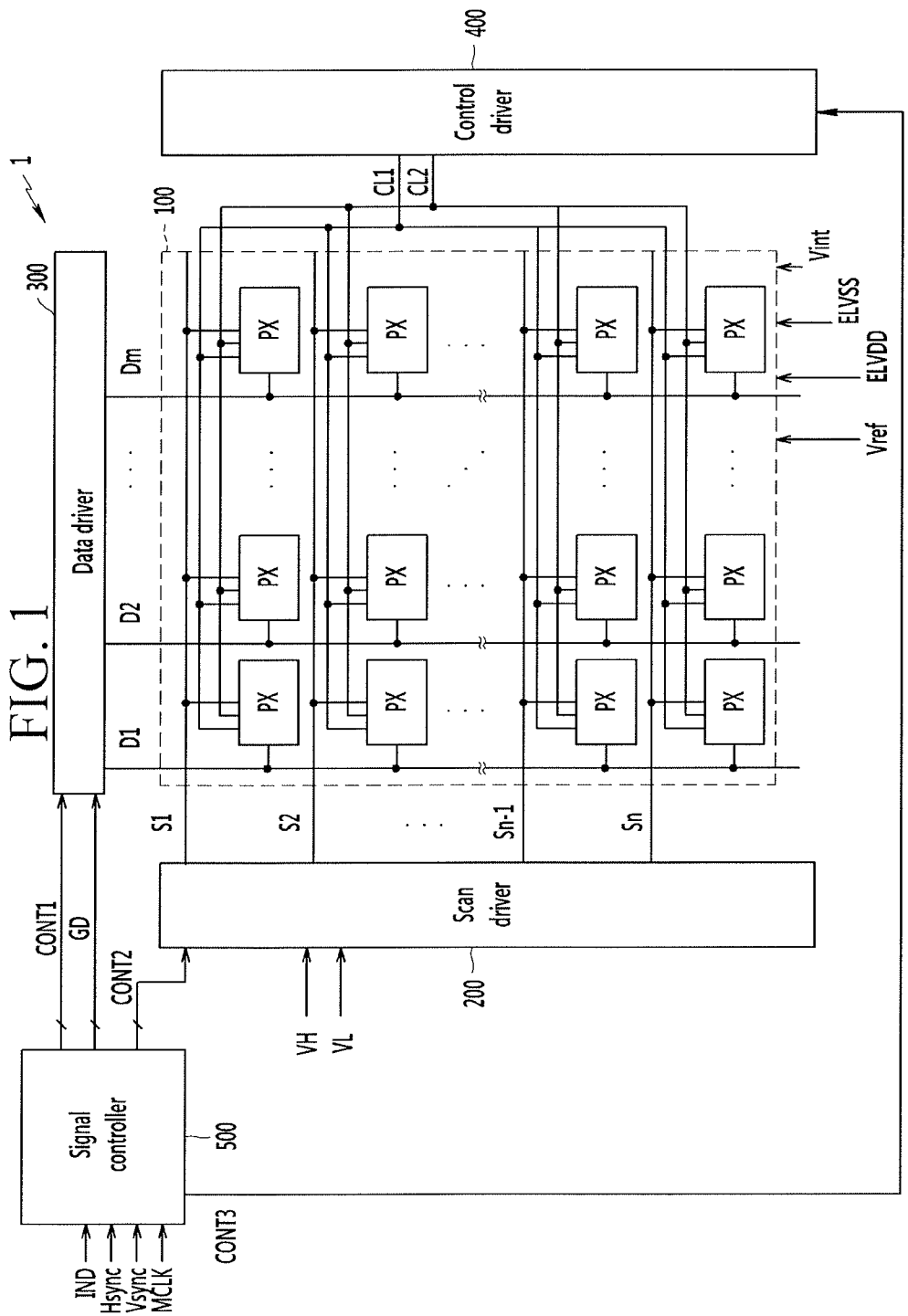
FIG. 1 illustrates an embodiment of a display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments. Like reference numerals refer to like elements throughout.

It should be understood that, when it is described that an element is "coupled" or "connected" to another element, the element may be "directly coupled" or "directly connected" to the another element or "coupled" or "connected" to the another element through a third element. In contrast, when one constituent element is "directly coupled to" or "directly connected to" another constituent element, it should be understood that there are no intervening element present.

FIG. 1 illustrates an embodiment of a display device 1 which includes a display unit 100, a scan driver 200, a data driver 300, a control driver 400, and a signal controller 500. The display unit 100 includes a display area having a plurality of pixels PX, a plurality of scan lines S1-Sn for transferring scan signals S[1]-S[n] (see, e.g., FIG. 3), a plurality of data lines D1-Dm for transferring data signals D[1]-D[m], a first control line CL1 for transferring a first control signal CL[1], and a second control line CL2 for transferring a second control signal CL[2]. Further, the display unit 100 receives a first driving voltage ELVDD, a second driving voltage ELVSS, an initialization voltage Vint, and a reference voltage Vref. Each pixel PX is connected to a corresponding data line and scan line, and is commonly connected to the first control line CL1 and the second control line CL2.

The scan driver 200 is connected to the scan lines S1-Sn to generate the scan signals S[1]-S[n] according to a scan control signal CONT2. In the scan control signal CONT2, a corn clock signal, a reset signal, a frame start signal, a coupling signal, and the like may be included As illustrated, for example, in FIG. 9, the scan driver 200 sequentially applies the scan signals S[1]-S[n] to the scan lines S1-Sn.

The scan signals S[1]-S[n] are signals for transferring data signals corresponding to the pixels PX. Each of the scan signals S[1]-S[n] has a low level for turning on a switching transistor TR1 (see, e.g., FIG. 2) and a high level for turning off the switching transistor TR1. A fourth driving voltage VH and a third driving voltage VL driving the scan driver 200 may be applied to the scan driver 200. The fourth driving voltage VH may be a voltage with a higher level than the third driving voltage VL.

The data driver 300 is connected to the data lines D1-Dm and generates the data signals D[1]-D[m] by sampling and holding an image data signal GD according to a data control signal CONT1. The data driver 300 transfers the data signals D[1]-D[m] to the data lines, respectively. The data signals D[1]-D[m] are signals (voltages) generated through an image processing process such as luminance correction for an external image signal IND.

The control driver 400 is connected to the first control line CL1 and the second control line CL2, and generates the first control signal CL[1] and the second control signal CL[2] control signal according to an initialization control signal CONT3 to apply the generated control signals to the pixels PX, respectively.

The signal controller 500 receives the external image signal IND and a synchronization signal to convert the image signal IND to the image data signal GD and to generate a control signal for controlling a function and for driving of each constituent element of the display device. The synchronization signal may include a vertical synchronization signal Vsync, a horizontal synchronization signal Hsync, and a main clock signal MCLK. The signal controller 500 divides the image signal IND by a frame unit according to the vertical synchronization signal Vsync and divides the image signal IND by a scan line unit according to the horizontal synchronization signal Hsync to generate the image data signal GD. The control signal includes a data control signal CONT1, a scan control signal CONT2, and an initialization control signal CONT3.

Figure 2:
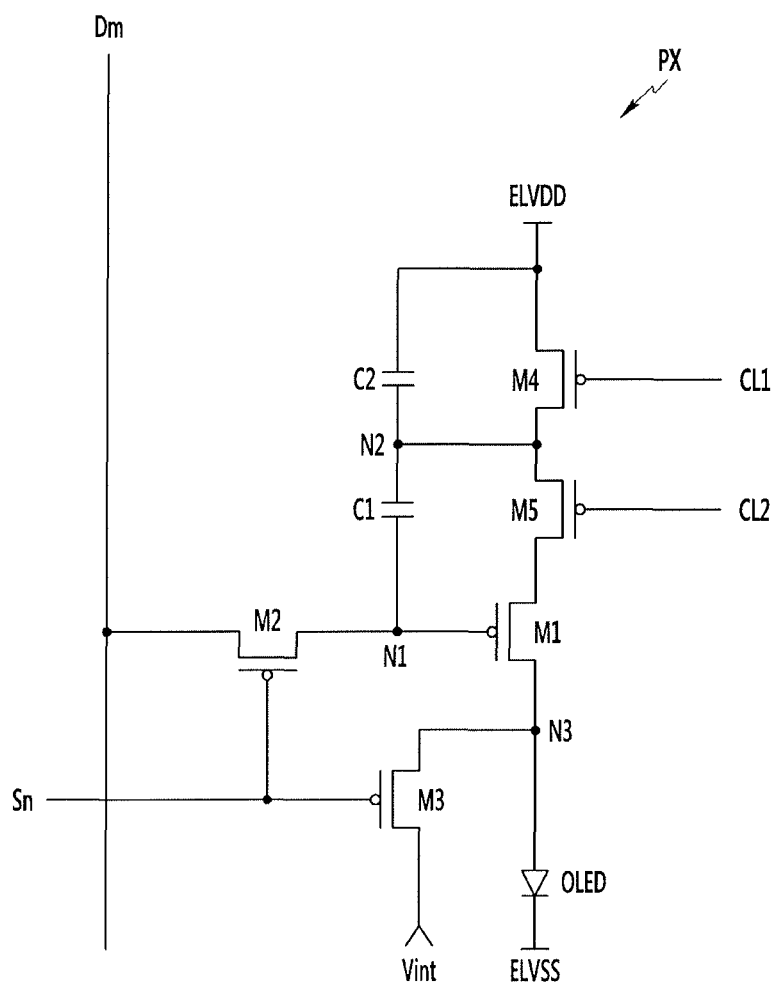
FIG. 2 illustrates an embodiment of a pixel.

FIG. 2 illustrates an embodiment of a pixel, which, for example, may be representative of the pixels PX in FIG. 1. In FIG. 2, for convenience, the pixel PX is illustrated as being connected to an n-th scan line Sn and an m-th data line Dm.

Referring to FIG. 2, the pixel PX includes a plurality of transistors M1-M5, a first capacitor C1, a second capacitor C2, and an organic light emitting diode OLED.

A first electrode of a first transistor M1 (a driving transistor) is connected to a second electrode of a fifth transistor M5, and the second electrode is connected to a third node N3. In addition, a control electrode of the first transistor M1 is connected to a first node N1. The first transistor M1 controls the amount of current flowing from the first driving voltage ELVDD to the second driving voltage ELVSS via the organic light emitting diode OLED. The amount of current is controlled based on a data signal D[m] (see, e.g., FIG. 3) applied to the first node N1.

A first electrode of the second transistor M2 is connected to the data line Dm, and a second electrode is connected to the first node N1. In addition, a control electrode of the second transistor M2 is connected to the scan line Sn. The second transistor M2 is turned on when the scan signal S[n] at a low level is supplied to the scan line Sn and then the data line Dm and the first node N1 are electrically connected to each other.

A first electrode of the third transistor M3 is connected to the third node N3, and a second electrode is connected to the initialization voltage Vint. In addition, a control electrode of the third transistor M3 is connected to the scan line Sn. The third transistor M3 is turned on when the scan signal S[n] at a low level is supplied to the scan line Sn to supply the initialization voltage Vint to the third node N3. The initialization voltage Vint is a low voltage at which an anode of the organic light emitting diode OLED may be initialized.

A first electrode of the fourth transistor M4 is connected to the first driving voltage ELVDD, and a second electrode is connected to a second node N2. In addition, a control electrode of the fourth transistor M4 is connected to the first control line CL1. The fourth transistor M4 is turned on when the first control line CL1 (see, e.g., FIG. 3) is supplied to the first control line CL1 to supply the first driving voltage ELVDD to the second node N2.

A first electrode of the fifth transistor M5 is connected to the second node N2, and a second electrode is connected to the first electrode of the first transistor M1. A control electrode of the fifth transistor M5 is connected to the second control line CL2. The fifth transistor M5 is turned on when the second control signal CL[2] is supplied to the second control line CL2 and then the second node N2 and the first transistor M1 are electrically connected to each other.

A first capacitor C1 is connected between the first node N1 and the second node N2. The first capacitor C1 stores a threshold voltage of the first transistor M1 and a voltage corresponding to the data signal.

A second capacitor C2 is connected between the second node N2 and the first driving voltage ELVDD. The second capacitor C2 has a predetermined capacitance to store the threshold voltage of the first transistor M1 and the voltage corresponding to the data signal D[m] in the first capacitor C1.

The anode of the organic light emitting diode OLED is connected to the third node N3, and a cathode is connected to the second driving voltage ELVSS. The organic light emitting diode OLED generates light with predetermined luminance according to current from the first transistor M1. The second driving voltage ELVSS may be set to a lower voltage than the first driving voltage ELVDD so that current may flow in the organic light emitting diode OLED.

Figure 3:
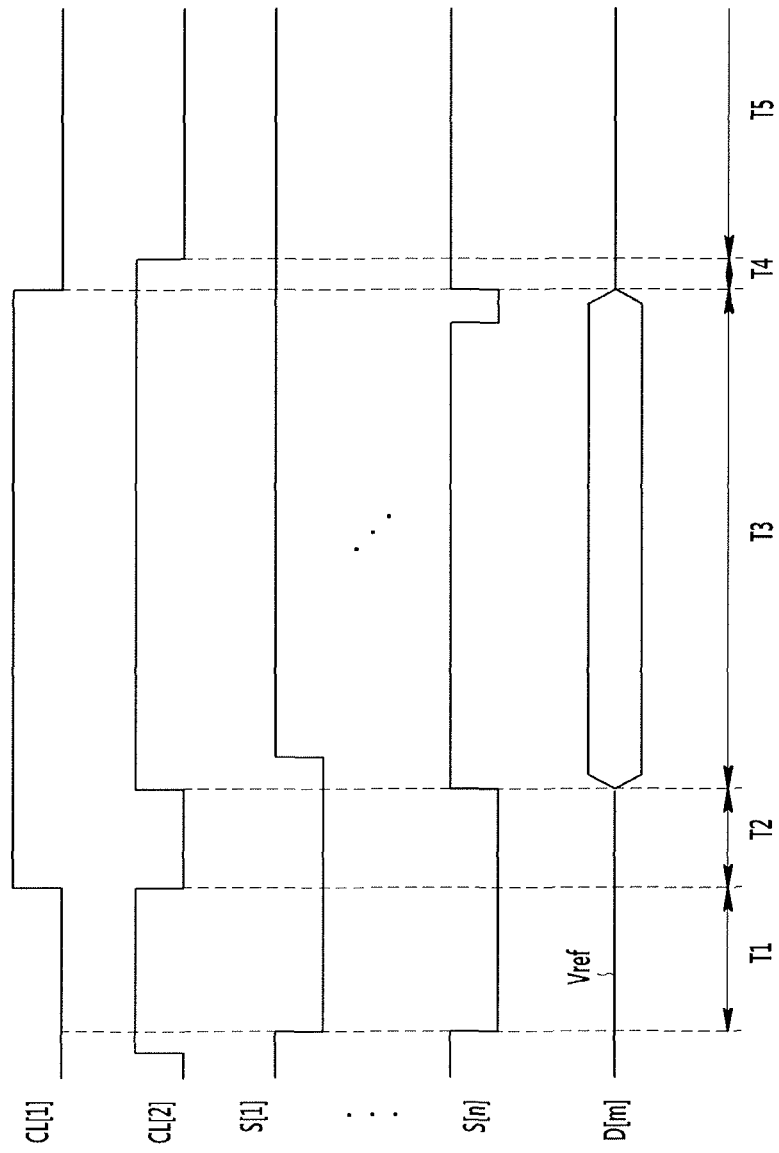
FIG. 3 illustrates an example of control signals for the display device.

FIG. 3 illustrates an example of control signals corresponding to one embodiment of a method for driving the pixel PX in FIG. 2. Referring to FIGS. 2 and 3, in a first period T1, the first control signal CL[1] at a low level is applied to the first control line CL1, the scan signals S[1]-S[n] at a low level are applied to the scan lines S1-Sn, and the reference voltage Vref is applied to the data line Dm. The reference voltage Vref may be set to a predetermined voltage within a voltage range of the data signal. Accordingly, the reference voltage Vref may be set to a voltage at which the first transistor M1 may be turned on.

When the first control signal CL[1] is supplied to the first control line CL1, the fourth transistor M4 is turned on. When the fourth transistor M4 is turned on, the first driving voltage ELVDD is supplied to the second node N2.

When the scan signals S[1]-S[n] at the low level are supplied to the scan lines S1-Sn, the corresponding second transistor M2 and third transistor M3 are turned on, respectively. When the second transistor M2 is turned on, the reference voltage Vref is applied to the first node N1. When the third transistor M3 is turned on, the initialization voltage Vint is applied to the third node N3. When the initialization voltage Vint is applied to the third node N3, the anode of the organic light emitting diode OLED is initialized. The initialization voltage Vint is applied to the anode of the organic light emitting diode OLED and then a parasitic capacitor parasitically formed may be discharged and initialized.

In a second period T2, the second control signal CL[2] is supplied to the second control line CL2, the scan signals S[1]-S[n] at the low level are supplied to the scan lines S1-Sn, and the reference voltage Vref is supplied to the data line Dm. When the second control signal CL[2] is supplied to the second control line CL2, the fifth transistor M5 is turned on. When the fifth transistor M5 is turned on, the second node N2 and the first electrode of the first transistor M1 are electrically connected to each other. In this case, since the reference voltage Vref is supplied to the first node N1 and the third transistor M3 maintains a turned-on state, a path including the fifth transistor M5, the first transistor M1, and the third transistor M3 is formed from the second node N2.

Then, the voltage of the second node N2 drops up to a voltage EVVDD−(Vref+Vth) obtained by adding the reference voltage Vref and the threshold voltage Vth of the first transistor M1 in the first driving voltage ELVDD. When the voltage of the second node N2 is set to a voltage Vref+Vth obtained by adding the threshold voltage Vth of the first transistor M1 to the reference voltage Vref, the first transistor M1 is turned off. Then, in the first capacitor C1, a voltage corresponding to the threshold voltage of the first transistor M1 is charged and thus the threshold voltage of the first transistor M1 is compensated.

In a third period T3, the scan signals S[1]-S[n] are sequentially supplied to the scan lines S1-Sn and the data signals are supplied to the data lines D1 to Dm so as to be synchronized according to the corresponding scan signal. For example, the scan signal is supplied to the scan line Sn and, thus, the second transistor M2 and the third transistor M3 are turned on. When the second transistor M2 is turned on, the data signal D[m] is supplied to the first node N1 and, thus, the voltage of the first node N1 is changed to the data signal D[m] at the reference voltage Vref. Then, the voltage of the second node N2 is changed according to a change amount of the first node N1 by a coupling effect. Actually, the voltage of the second node N2 may be changed to a predetermined voltage based on a capacitance ratio of the first capacitor C1 and the second capacitor C2. Then, in the first capacitor C1, the voltage of the second node N2 is charged based on a voltage obtained by adding the threshold voltage Vth of the first transistor M1 and the data signal D[m].

In a fourth period T4, when the first control signal CL[1] with an enable level is supplied to the first control line CL1, the fourth transistor M4 is turned on. When the fourth transistor M4 is turned on, the first driving voltage ELVDD is supplied to the second node N2. In this case, the first node N1 is in a floated state and for the third period T3, the voltage charged in the first capacitor C1 is stably maintained.

In a fifth period T5, when the second control signal CL[2] with an enable level is supplied to the second control line CL2, the fifth transistor M5 is turned on. When the fifth transistor M5 is turned on, the first electrode of the first transistor M1 is electrically connected with the first driving voltage ELVDD via the second node N2. Then, a current corresponding to the data signal D[m flows in the organic light emitting diode OLED through the first transistor M1. Thus, the organic light emitting diode OLED emits light with predetermined luminance.

In the second period T2, the threshold voltages of the first transistors M1 in the pixels PX are simultaneously compensated. In this case, the second period T2 may be sufficiently allocated. As a result, even in the case of high-speed driving of 120 Hz or more, the threshold voltage of the first transistor M1 may be stably compensated.

Figure 4:
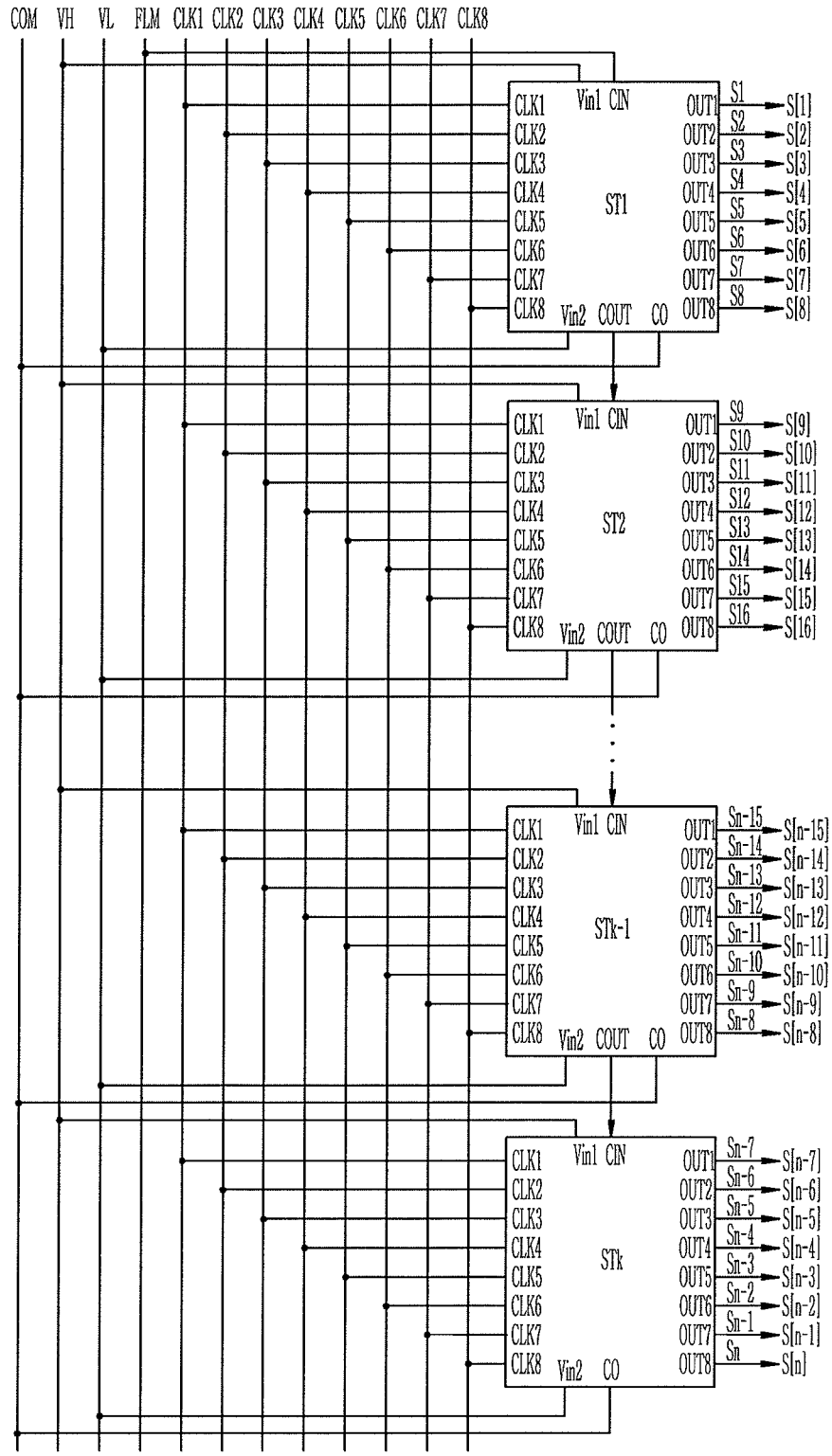
FIG. 4 illustrates an embodiment of a scan driver.

FIG. 4 illustrates an embodiment of a scan driver 200 which includes a plurality of stages ST1-STk dependently connected to each other. Each of the stages ST1-STk is connected to a COM clock signal line COM, a fourth driving voltage VH, a third driving voltage VL, and a plurality of clock signal lines CLK1-CLK8, and the first stage ST1 is connected to a frame start signal line FLM.

Each of the stages ST1-STk includes a COM clock signal input terminal CO, a first driving voltage input terminal Vin1, a second driving voltage input terminal Vin2, a plurality of clock signal input terminals CLK1-CLK8, a carry signal input terminal Cin to which a previous stage STk-1 carry signal CR[k-1] or a frame start signal is input, a carry signal output terminal Cout, and eight scan signal output terminals OUT1-OUT8.

As indicated, each of the stages ST1-STk receives the fourth driving voltage VH and the third driving voltage VL. Each of the stages ST1-STk generates scan signals, for example, by setting a respective one of eight scan signals S[1]-S[8], S[9]-S[16], . . . , S[n-15]-S[n-8], S[n-9]-S-[n] as a predetermined block driving unit group. Each block driving unit group corresponds to clock signals CLK[1]-CLK[8] according to a frame start signal [FLM] in the case of stage ST1 or a carry signal of a previous stage as in the case of the remaining stages.

Figure 5:
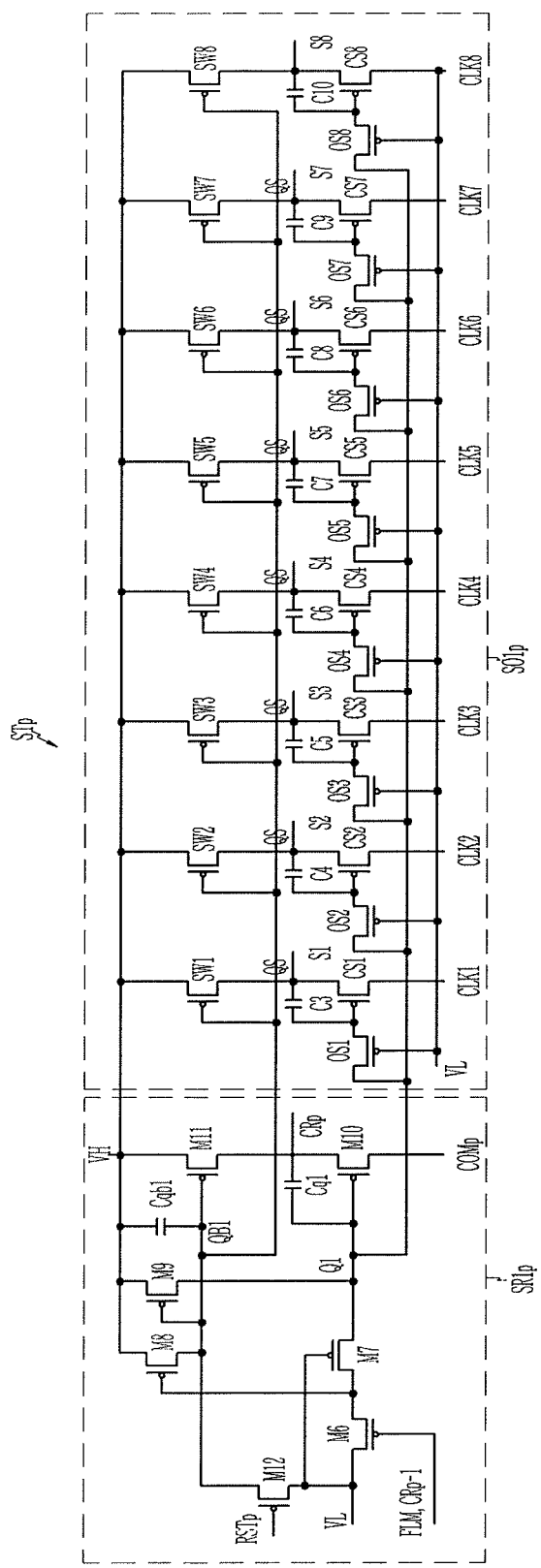
FIG. 5 illustrates an embodiment of a stage of the scan driver.

FIG. 5 illustrates an embodiment of one stage STp of the stages in FIG. 4, which may be representative of the stages ST1 to STk. Referring to FIG. 5, the stage STp includes a shift register unit SR1p and a scan signal output unit SO1p.

The shift register unit SR1p includes a plurality of transistors M6-M11 and a plurality of capacitors Cqb1 and Cq1. The sixth transistor M6 includes a first electrode connected to the third driving voltage VL, a second electrode connected to a control electrode of an eighth transistor, and a control electrode connected to the frame start signal line FLM or a carry signal line CRp-1 of the previous stage.

The seventh transistor M7 includes a first electrode connected to the second electrode of the sixth transistor M6, a second electrode connected to a fourth node Q1, and a control electrode connected to the third driving voltage VL.

The eighth transistor M8 includes a first electrode connected to the fourth driving voltage VH, a second electrode connected to a fifth node QB1, and a control electrode connected to the second electrode of the sixth transistor M6.

The ninth transistor M9 includes a first electrode connected to the fourth driving voltage VH, a second electrode connected to the fourth node Q1, and a control electrode connected to the fifth node QB1.

The tenth transistor M10 includes a first electrode connected to the carry signal line CRp, a second electrode connected to the COM clock signal line COMp, and a control electrode connected to the fourth node Q1.

The eleventh transistor M11 includes a first electrode connected to the fourth driving voltage VH, a second electrode connected to the carry signal line CRp, and a control electrode connected to the fifth node QB1.

The twelfth transistor M12 includes a first electrode connected to the fifth node QB1, a second electrode connected to the third driving voltage VL, and a control electrode connected to a reset signal line RSTp.

The capacitor Cqb1 is connected between the first electrode and the control electrode of the eleventh transistor M11. The capacitor Cq1 is connected between the first electrode and the control electrode of the eleventh transistor M11.

The scan signal output unit SO1p includes a plurality of switches Sw1-Sw8, a plurality of on switches OS1-OS8, a plurality of clock switches CS1-CS8, and a plurality of capacitors C3-C10. Each of the switches Sw1-Sw8 includes a first electrode connected to the fourth driving voltage VH, a second electrode connected to a node QS connected to a corresponding one of the scan lines S1-S8, and a control electrode connected to the fifth node QB1.

Each of the clock switches CS1-CS8 includes a first electrode connected to a corresponding one of the clock signal lines CLK1-CLK8, a second electrode connected to the node QS connected to a corresponding one of the scan lines S1-S8, and a control electrode connected to the second electrode of a corresponding one of the on switches OS1-OS2.

Each of the capacitors C3-C10 is connected between the first electrode and the control electrode of a corresponding one of the clock switches CS1-CS8.

Each of the on switches OS1-OS2 includes a first electrode connected to the fourth node Q1, a second electrode connected to the control electrode of the corresponding one of the clock switches CS1-CS8, and a control electrode connected to the third driving voltage VL.

Accordingly, when the clock signals CLK[1]-CLK[8] at a low level is applied to the first electrode of each of the clock switches CS1-CS8, a voltage with a sufficiently low level is applied to the control electrode of each of the clock switches CS1-CS8 by a coupling effect of the capacitors C3-C10.

Figure 6:
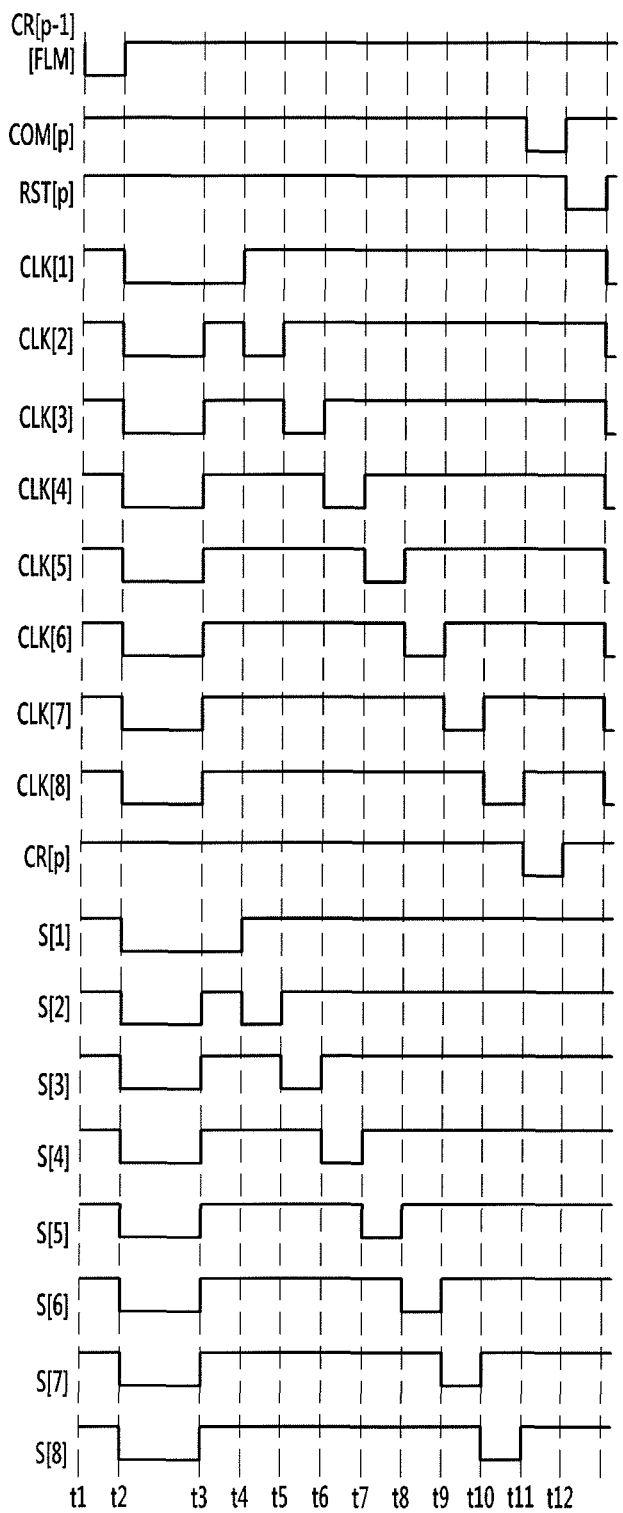
FIG. 6 illustrates an example of control signals for the stage.

FIG. 6 illustrates an example of control signals for the stage in FIG. 5. Operation of a p-th stage is described with reference to FIG. 6. A second driving power supply at a low level is applied to the control electrode of the seventh transistor M7 and the control electrode of the on switches OS1-OS8, respectively. Then, the seventh transistor M7 and the plurality of on switches OS1-OS8 are turned on at all times.

At time t1, the frame signal [FLM] at the low level or the carry signal CR[p-1] of the previous stage at the low level is applied to the control electrode of the sixth transistor M6 and then the sixth transistor M6 is turned on.

The third driving voltage VL at the low level is applied to the fourth node Q1 through the sixth transistor M6 and the seventh transistor M7. Accordingly, the tenth transistor M10 having a control electrode connected to the fourth node Q1 is turned on, and the capacitor Cq1 is charged with the voltage of the fourth node Q1.

The third driving voltage VL at the low level is applied to the control electrode of the clock switches CS1-CS8 through the on switches OS1-OS8, and then the clock switches CS1-CS8 are turned on. Accordingly, eight scan signals S[1]-S[8] corresponding to the clock signals CLK[1])-CLK[8] at the high level are simultaneously output to the scan lines S1-S8.

Further, at time t1, the third driving voltage VL at the low level is applied to the control electrode of the eighth transistor M8, and then the eighth transistor M8 is turned on. The fourth driving voltage VH at the high level is applied to the fifth node QB1 through the eighth transistor M8. Accordingly, the ninth transistor M9 and the eleventh transistor M11 having control electrodes connected to the fifth node QB1 are turned off.

At time t2, the clock signals CLK[1]-CLK[8] are converted from a high level to a low level. The eight scan signals S[1]-S[8], which correspond to the clock signals CLK[1]-CLK[8] at the low level, are then simultaneously output to the scan lines S1-S8.

A period between the time t2 and a time t3 is a period corresponding to the first period T1 and the second period T2 described in FIG. 3. As described in FIG. 3, the organic light emitting diode OLED is initialized in the first period T1 and the threshold voltage of the first transistor M1 is compensated in the second period T2.

In the time t3 to a time t10, the eight clock signals CLK[1]-CLK[8] at the low level are sequentially applied, and the eight scan signals S[1]-S[8] corresponding to the clock signals CLK[1]-CLK[8] at the low level are sequentially output to the corresponding scan line of the scan lines S1-S8.

At a time t11, the COM clock signal COM[p] at the low level is applied to the first electrode of the tenth transistor M10, and the carry signal CR[p] corresponding to the low level is output to the carry signal line CRp by a coupling effect of the capacitor Cq1. Accordingly, a full low carry signal CR[p] may be output by the coupling effect of the capacitor Cq1.

The full low carry signal CR[p] of a current stage is transferred to a next stage, and the transistor corresponding to the sixth transistor M6 is turned on at the next stage. The next stage may operate by the same method as the operation of the periods t1-t12 of the current stage STp.

At time t12, the reset signal RST[p] at the low level is applied to the control electrode of the twelfth transistor M12 and then the twelfth transistor M12 is turned on. The third driving voltage VL at the low level is applied to the fifth node QB1 through the twelfth transistor M12, and the ninth transistor M9, the eleventh transistor M11, and the plurality of switches Sw1-Sw8 are turned on.

The fourth driving voltage VH at the high level is applied to the fourth node Q1 through the ninth transistor M9, and then the tenth transistor M10 and the clock switches CS1-CS8 are turned off. The carry signal CR[p] corresponding to the fourth driving voltage VH at the high level is output to the carry signal line CRp through the eleventh transistor M11.

The scan signals S[1]-S[8] corresponding to the fourth driving voltage VH at the high level are simultaneously output to the scan lines S1-S8 through switches Sw1-Sw8.

Accordingly, the previous stage is turned off (a high-level scan signal) while the current stage is turned on to output a unit group scan signal (a low level scan signal). Thus, each of the stages ST1-STk may be independently driven.

Figure 7:
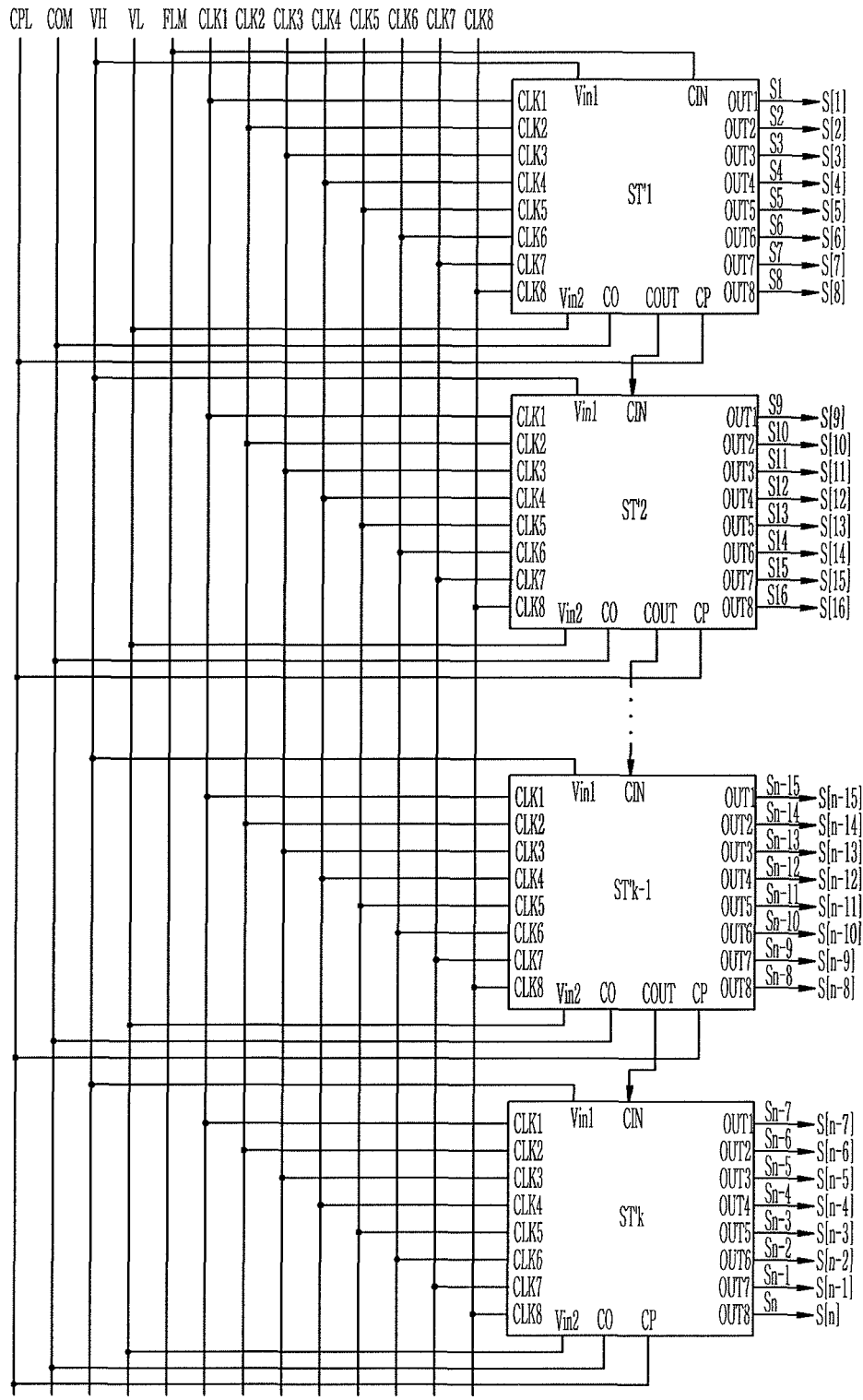
FIG. 7 illustrates another embodiment of a scan driver.

FIG. 7 illustrates another embodiment of a scan driver scan driver 201 which has a plurality of stages ST'1-ST'k dependently connected to each other. In comparison with the stages ST1-STk in FIG. 4, there is a difference in that each of the stages ST'1-ST'k is connected to a coupling clock signal line CPL and includes a coupling clock signal input terminal CP.

Figure 8:
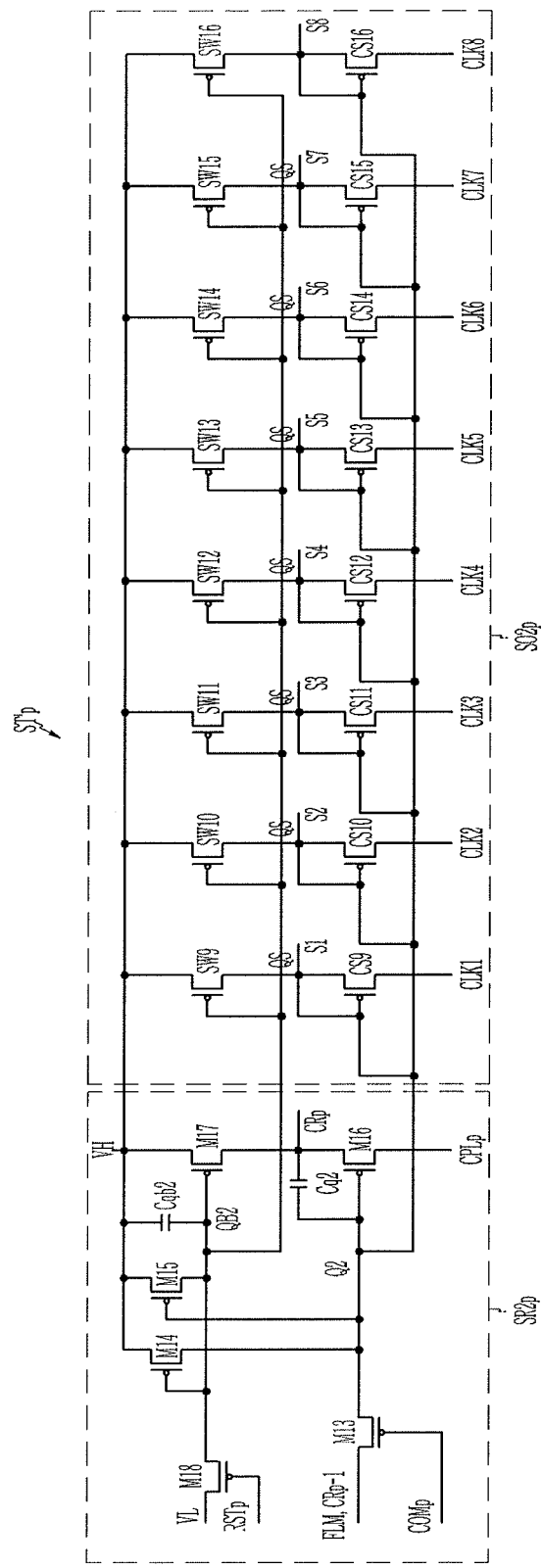
FIG. 8 illustrates an embodiment of a stage of the scan driver in FIG. 7.

FIG. 8 illustrates an embodiment of a stage ST'p, which may represent the plurality of stages ST'1-ST'k in FIG. 7. Referring to FIG. 8, the stage ST'p includes a shift register unit SR2p and a scan signal output unit SO2p.

The shift register unit SR2p includes a plurality of transistors M13-M18 and a plurality of capacitors Cq2 and Cqb2. The thirteenth transistor M13 includes a first electrode connected to a frame start signal line FLM or a carry signal line CRp-1 of a previous stage ST'p-1, a second electrode connected to a sixth node Q2, and a control electrode connected to a COM clock signal line COMp.

The fourteenth transistor M14 includes a first electrode connected to the fourth driving voltage VH, a second electrode connected to the sixth node Q2, and a control electrode connected to a seventh node QB2.

The fifteenth transistor M15 includes a first electrode connected to the fourth driving voltage VH, a second electrode connected to the sixth node Q2, and a control electrode connected to the seventh node QB2.

The sixteenth transistor M16 includes a first electrode connected to the carry signal line CRp, a second electrode connected to the coupling clock signal line CPL, and a control electrode connected to the sixth node Q2.

The seventeenth transistor M17 includes a first electrode connected to the fourth driving voltage VH, a second electrode connected to the carry signal line CRp, and a control electrode connected to the seventh node QB2.

The eighteenth transistor M18 includes a first electrode connected to the third driving voltage VL, a second electrode connected to the seventh node QB2, and a control electrode connected to the reset signal line RSTp.

The capacitor Cqb2 is connected between the first electrode and the control electrode of the seventeenth transistor M17, and the capacitor Cb2 is connected between the first electrode and the control electrode of the sixteenth transistor M16.

A scan signal output unit SO2 includes a plurality of switches Sw9-Sw16 and a plurality of clock switches CS9-CS16. Each of the switches Sw9-Sw16 includes a first electrode connected to the fourth driving voltage VH, a second electrode connected to node QS which is connected to a corresponding one of the scan lines S1-S8, and a control electrode connected to the seventh node QB2.

Each of the clock switches CS9-CS16 includes a first electrode connected to a corresponding one of the clock signal lines CLK1-CLK8, a second electrode connected to node QS which is connected to a corresponding one of the scan lines S1-S8, and a control electrode connected to the seventh node QB2.

Figure 9:
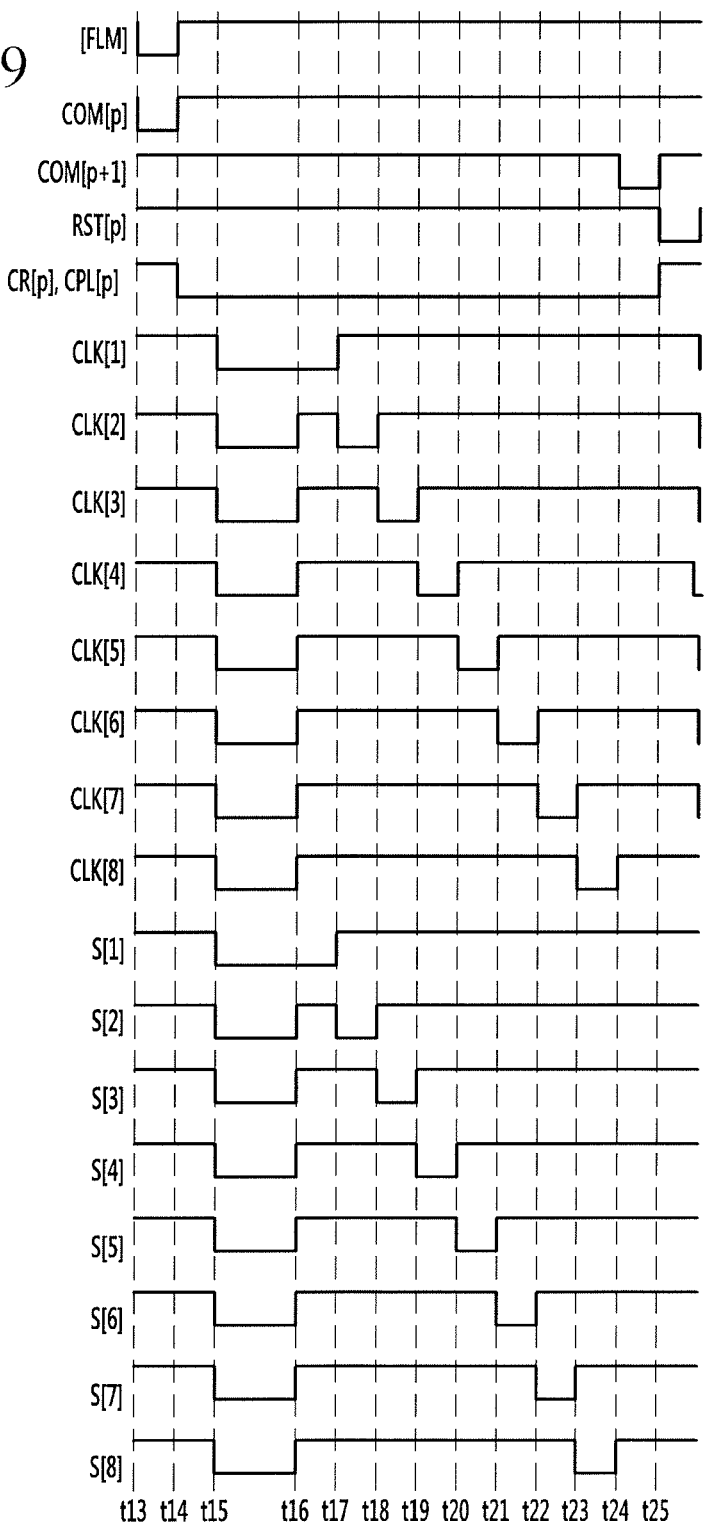
FIG. 9 illustrates an example of control signals the stage in FIG. 8.

FIG. 9 illustrates an example of control signals for the stage ST'p in FIG. 8. Operation of a p-th stage is described with reference to FIG. 9. At time t13, the COM clock signal COM[p] of the low level is applied to the control electrode of the thirteenth transistor, and then the thirteenth transistor M13 is turned on. A frame signal [FLM] with a first low level or a carry signal CR[p-1] of a previous stage ST'p-1 with the first low level is applied to the sixth node Q2 through the thirteenth transistor M13.

The fifteenth transistor M15 and the sixteenth transistor M16 have control electrodes connected to the sixth node Q2, and the clock switches CS9-CS16 are turned on, and the capacitor Cq2 is charged with the voltage of the sixth node Q2.

The fourth driving voltage VH at a high level is applied to the seventh node QB2 through the fifteenth transistor M15, the fourteenth transistor M14 and the seventeenth transistor M17 have control electrodes connected to the seventh node QB2, and the switches Sw9-Sw16 are turned off.

A coupling clock signal CP[p] at a low level is output to the carry signal line CRp through the sixteenth transistor M16 turned on at a time t14. In this case, the sixth node Q2 is applied with a second low level lower than the first low level by the coupling effect of the capacitor Cq2.

At time t15, the clock signals CLK[1]-CLK[8] are converted from a high level to a low level, and the eight scan signals S[1]-S[8] corresponding to the clock signals CLK[1])-CLK[8] at the low level are simultaneously output to the scan lines S1-S8.

A period between the time t12 and a time t16 is a period corresponding to the first period T1 and the second period T2 described in FIG. 3. As described in FIG. 3, the organic light emitting diode OLED is initialized in the first period T1 and the threshold voltage of the first transistor M1 is compensated in the second period T2.

At time t16 to time t23, the eight clock signals CLK[1])-CLK[8] at the low level are sequentially applied, and the eight scan signals S[1]-S[8] corresponding to the clock signals CLK[1])-CLK[8] at the low level are sequentially output to the corresponding scan line of the scan lines S1-S8.

At time t24, a COM clock signal COM[p+1] at a low level is transferred to a next stage. At the next stage, a transistor corresponding to the thirteenth transistor M13 is turned on. The next stage operates by the same method as the operation of the periods t13-t25 of the current stage ST'p.

At time t25, a reset signal RST[p] at a low level is applied to the control electrode of the eighteenth transistor M18 through the reset signal line RSTp, and then the eighteenth transistor is turned on. The third driving voltage VL at the low level is applied to the seventh node QB2 through the eighteenth transistor. Accordingly, the fourteenth transistor M14 and the seventeenth transistor M17 have control electrodes connected to the seventh node QB2, and the switches Sw9-Sw16 are turned on.

The fourth driving voltage VH at the high level is applied to the sixth node Q2 through the fourteenth transistor M14. The fifteenth transistor M15 and the sixteenth transistor M16 have control electrodes connected to the sixth node Q2, and the clock switches CS9-CS16 are turned off.

The carry signal CR[p] corresponding to the fourth driving voltage VH at the high level is output to the carry signal line CRp through the seventeenth transistor M17.

The eight scan signals S[1]-S[8] corresponding to the fourth driving voltage VH at the high level are simultaneously output to the scan lines S1-S8 through the switches Sw9-Sw16.

Accordingly, the previous stage is turned off (a high-level scan signal) while the current stage is turned on to output a unit group scan signal (a low level scan signal). Thus, each of the plurality of stages ST'1-ST'k may be independently driven.

In one or more of the aforementioned embodiments, eight scan signal output units of each of the stages ST1-STk have been described. Also, eight clock signals CLK1-CLK8, clock switches CS1-CS8, and switches Sw1-Sw8 are illustrated. In another embodiment, the number of scan signal output units, clock signals, clock switches, and/or switches may be a different. Further, the scan driver 200 was described to include pMOS transistors, with low level as the enable level. In another embodiment, nMOS transistors may be used, with a high level as an enable level.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A scan driving circuit, comprising:
a plurality of stages, each of the stages including:
    a shift register including a first node to receive a first driving voltage according to a control signal and a second node to receive the first driving voltage according to a reset signal; and
    a scan signal output unit to output a plurality of scan signals to a respective plurality of scan lines, the scan signal output unit including a plurality of clock switches controlled according to a voltage of the first node and a plurality of scan switches controlled according to a voltage of the second node, wherein:
    the clock switches are to sequentially output a plurality of clock signals to a respective plurality of third nodes, the third nodes connected to respective ones of the scan lines, and
    the scan switches are to output a second driving voltage to the third nodes connected to respective one of the scan lines, wherein the scan signal output unit is to simultaneously receive the clock signals in a predetermined unit group having at least two clock signals and to simultaneously output the scan signals as unit group scan signals in accordance with the at least two clock signals, wherein:
    the stages include a current stage and a previous stage, and while the current stage outputs the clock signals to the third nodes corresponding to the scan signals, the previous stage is turned off, wherein:
    the control signal is a carry signal of the previous stage, and the shift register includes:
        a first transistor including a first electrode to receive the first driving voltage, a second electrode connected to the first node, and a control electrode to receive the carry signal of the previous stage;
        a second transistor including a first electrode to receive the second driving voltage, a second electrode connected to receive a carry signal of the current stage, and a control electrode connected to the second node;
        a third transistor including a first electrode to receive the carry signal of the current stage, a second electrode connected to a COM clock signal line, and a control electrode connected to the first node; and
        a fourth transistor including a first electrode to receive the second driving voltage, a second electrode connected to the second node, and a control electrode connected to the second electrode of the first transistor.

2. The scan driving circuit of claim 1, wherein the shift register includes:
    a fifth transistor including a first electrode to receive the second driving voltage, a second electrode connected to the first node, and a control electrode connected to the second node;
    a sixth transistor including a first electrode to receive the first driving voltage, a second electrode connected to the second node, and a control electrode to which the reset signal is applied; and
    a seventh transistor including a first electrode connected to the second electrode of the first transistor, a second electrode connected to the first node, and a control electrode to which the first driving voltage is applied.

3. The scan driving circuit of claim 2, wherein:
the clock switches include first electrodes to receive respective ones of the clock signals, second electrodes connected to the third nodes which are connected to corresponding ones of the scan lines, and control electrodes connected to the first node, the scan driving circuit further including:
    a plurality of on switches, each of the on switches including a first electrode connected to the first node, a second electrode connected to the control electrode of a corresponding one of the clock switches, and a control electrode to receive the first driving voltage; and
    a plurality of capacitors, each of the capacitors connected between the second electrode and the control electrode of a corresponding one of the clock switches, the on switches to be continuously turned on.

4. A method for driving a scan driving circuit including a plurality of stages, each of the stages including a shift register and a scan signal output unit, the shift register including a first node and a second node, the scan signal output unit including a plurality of clock switches controlled according to a voltage of the first node and a plurality of scan switches controlled according to a voltage of the second node, the method comprising:
    applying a first driving voltage to the first node according to a control signal;

inputting a plurality of clock signals to each of the plurality of stages, including initializing the stage by simultaneously inputting the clock signals in a predetermined unit group of at least two clock signals, the nodes simultaneously outputting scan signals to respective ones of the scan lines as unit group scan signals;

sequentially outputting the clock signals to nodes connected to a respective plurality of scan lines;

outputting a carry signal according to a COM clock signal;

applying the first driving voltage to the second node according to a reset signal; and outputting a second driving voltage to the nodes connected to the scan lines, wherein:

the stages include a current stage and a previous stage, and the method further includes turning off the previous stage while the clock signal are output to the nodes connected to the scan lines in the current stage, wherein the shift register includes:

a first transistor including a first electrode to receive the first driving voltage, a second electrode connected to the first node, and a control electrode to receive a carry signal of the previous stage;

a second transistor including a first electrode to receive the second driving voltage, a second electrode connected to a carry signal line of the current stage, and a control electrode connected to the second node;

a third transistor including a first electrode connected to the carry signal line of the current stage, a second electrode connected to a COM clock signal line, and a control electrode connected to the first node; and a fourth transistor including a first electrode to receive the second driving voltage is applied, a second electrode connected to the second node, and a control electrode connected to the second electrode of the first transistor, and the control signal is a carry signal of the previous stage.

5. The method of claim 4, wherein the shift register includes:

a fifth transistor including a first electrode to receive the second driving voltage, a second electrode connected to the first node, and a control electrode connected to the second node;

a sixth transistor including a first electrode to receive the first driving voltage, a second electrode connected to the second node, and a control electrode connected to a reset signal line; and a seventh transistor including a first electrode connected to the second electrode of the first transistor, a second electrode connected to the first node, and a control electrode to receive the first driving voltage.

6. The method of claim 5, wherein the scan signal output unit includes:

a plurality of clock switches, each clock switch including a first electrode to receive a corresponding one of the clock signals, a second electrode connected to a corresponding one of the scan lines, and a control electrode connected to the first node;

a plurality of on switches, each of the on switches including a first electrode connected to the first node, a second electrode connected to the control electrode of a corresponding one of the clock switches, and a control electrode to receive the first driving voltage; and a plurality of capacitors, each of the capacitors connected between the second electrode and the control electrode of a corresponding one of the clock switches, the on switches continuously turned on.

* * * * *